United States Patent
Kim

(10) Patent No.: US 9,178,124 B2
(45) Date of Patent: Nov. 3, 2015

(54) LIGHT EMITTING DEVICE AND LIGHT EMITTING DEVICE PACKAGE

(71) Applicant: Samsung Electronics Co., Ltd., Suwon-Si, Gyeonggi-Do (KR)

(72) Inventor: Jung Hoon Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 71 days.

(21) Appl. No.: 14/149,117

(22) Filed: Jan. 7, 2014

(65) Prior Publication Data

US 2014/0197436 A1    Jul. 17, 2014

(30) Foreign Application Priority Data

Jan. 11, 2013    (KR) ................ 10-2013-0003265

(51) Int. Cl.
*H01L 33/00* (2010.01)
*H01L 33/60* (2010.01)
*H01L 23/00* (2006.01)
*H01L 33/50* (2010.01)
*H01L 33/56* (2010.01)

(52) U.S. Cl.
CPC ............. *H01L 33/60* (2013.01); *H01L 24/17* (2013.01); *H01L 33/501* (2013.01); *H01L 33/56* (2013.01); *H01L 2224/16225* (2013.01); *H01L 2224/48091* (2013.01); *H01L 2224/73265* (2013.01); *H01L 2924/01322* (2013.01); *H01L 2924/12041* (2013.01); *H01L 2924/15787* (2013.01)

(58) Field of Classification Search
CPC ............ H01L 2924/12041; H01L 2924/00; H01L 33/501; H01L 2224/48091; H01L 2924/00014; H01L 33/60; H01L 2224/73265; H01L 33/502; H01L 33/56; H01L 24/17; H01L 2224/16225
See application file for complete search history.

(56) References Cited

U.S. PATENT DOCUMENTS

| | | | |
|---|---|---|---|
| 7,083,335 B2 * | 8/2006 | Miao et al. | 385/92 |
| 2002/0167804 A1* | 11/2002 | Towle | 361/765 |
| 2009/0212695 A1* | 8/2009 | Kim et al. | 313/506 |
| 2011/0025951 A1* | 2/2011 | Jones | 349/70 |
| 2012/0156436 A1* | 6/2012 | Kim et al. | 428/172 |
| 2013/0215597 A1* | 8/2013 | Davis | 362/84 |
| 2013/0215598 A1* | 8/2013 | Guzan et al. | 362/84 |
| 2013/0221369 A1* | 8/2013 | Bergbauer et al. | 257/76 |

FOREIGN PATENT DOCUMENTS

| | | |
|---|---|---|
| JP | 2006-186165 A | 7/2006 |
| JP | 2009-084403 A | 4/2009 |
| JP | 2009-084742 A | 4/2009 |
| JP | 2010-003791 A | 1/2010 |
| JP | 2011-096940 A | 5/2011 |
| KR | 2009-0102951 A | 10/2009 |
| KR | 2011-0055425 A | 5/2011 |
| KR | 10-1045445 B1 | 6/2011 |
| WO | WO-2009/041107 A1 | 4/2009 |
| WO | WO-2009/041108 A1 | 4/2009 |

* cited by examiner

*Primary Examiner* — Victor A Mandala
(74) *Attorney, Agent, or Firm* — Harness, Dickey & Pierce, P.L.C.

(57) ABSTRACT

According to example embodiments, a light emitting device package includes a package body including nanofibers and light-reflective particles dispersed in a resin, first and second electrodes in the package body, and a light emitting device on the package body. The emitting device is electrically connected to the first and second electrodes.

19 Claims, 12 Drawing Sheets

LIGHT EMITTING DEVICE AND LIGHT EMITTING DEVICE PACKAGE

CROSS-REFERENCE TO RELATED APPLICATIONS

This application claims priority under 35 U.S.C. §119 to Korean Patent Application No. 10-2013-0003265 filed on Jan. 11, 2013, in the Korean Intellectual Property Office, the entire disclosure of which is incorporated herein by reference.

BACKGROUND

1. Field

Example embodiments relate to a light emitting device package.

2. Description of the Related Art

In general, a semiconductor light emitting device may be provided in the form of a package including an electrode structure for applying driving power to the light emitting device, and in order to obtain desired color characteristics, a semiconductor light emitting device may have a wavelength conversion unit. Meanwhile, a semiconductor light emitting device, when driven, may emit a large amount of heat, so a difference in coefficients of thermal expansion between components included in the package may result in a defective package and a wavelength conversion unit may be damaged to degrade optical quality of light wavelengths converted thereby.

SUMMARY

Example embodiments relate to a light emitting device package in which a defect due to a difference between coefficients of thermal expansion may be reduced.

Example embodiments also relate to a light emitting device including a wavelength conversion unit in which a degradation of optical quality may be reduced.

According to example embodiments, a light emitting device package includes: a package body including a nanofibers and light-reflective particles dispersed in a resin; first and second electrodes in the package body; and a light emitting device on the package body. The light emitting device is electrically connected to the first and second electrodes.

In example embodiments, the resin may include one epoxy, silicone, modified silicone, a urethane resin, an oxetane resin, acryl, polycarbonate, polyimide, and any combination thereof.

In example embodiments, the nanofibers may include at least one of chitin and cellulose.

In example embodiments, a width of the nanofibers may be equal to or less than about 80 nm.

In example embodiments, a length of the nanofibers may be equal to or greater than about 1 μm.

In example embodiments, a weight ratio of the nanofibers to the resin may range from 1% to about 5%.

In example embodiments, a coefficient of thermal expansion of the package body may range from about 4 ppm/K to about 10 ppm/K at a temperature ranging from about 20° C. to about 150° C.

In example embodiments, a weight ratio of the light-reflective powder particles to the resin may range from about 20% to about 80%.

According to example embodiments, a light emitting device includes: a light emitting laminate including a first conductivity-type semiconductor layer, an active layer and a second conductivity-type semiconductor layer stacked on each other; and a wavelength conversion layer on the light emitting laminate. The wavelength conversion layer includes nanofibers and a wavelength conversion material dispersed in a light-transmissive resin.

In example embodiments, the nanofibers may include at least one of chitin and cellulose.

In example embodiments, a weight ratio of the nanofibers to the resin may range from 0.1% to less than 1%.

In example embodiments, one surface of the wavelength conversion layer may contact the light emitting laminate.

In example embodiments, the wavelength conversion layer may directly contact a light emitting surface of the light emitting laminate.

In example embodiments, a thickness of the wavelength conversion layer may range from about 20 μm to about 200 μm.

In example embodiments, a weight ratio of the wavelength conversion layer to the resin may range from about 50% to about 300%.

According to example embodiments, a light emitting device may include: a light emitting laminate and a wavelength conversion layer on the light emitting laminate. The wavelength conversion layer may include nanofibers and a wavelength conversion material dispersed in a light-transmissive resin.

In example embodiments, at least some of the nanofibers may be spaced part from at least some of the wavelength conversion material.

In example embodiments, a width of the nanofibers may be less than or equal to 80 nm, and the nanofibers may include at least one of chitin and cellulose.

According to example embodiments, a light emitting device package may include: a package body including fibers and light-reflective particles dispersed in a resin material; and the foregoing light-emitting device on the package body.

In example embodiments, the fibers may include at least one of chitin and cellulose, and a width of the fibers may be less than or equal to 80 nm.

BRIEF DESCRIPTION OF THE DRAWINGS

The above and other aspects, features and other advantages of example embodiments will be more clearly understood from the following description on non-limiting embodiments taken in conjunction with the accompanying drawings, in which like reference characters to the same parts throughout the different views. The drawings are not necessarily to scale, emphasis instead being placed up illustrating the principles of inventive concepts. In the drawings.

DETAILED DESCRIPTION

Figure 1:
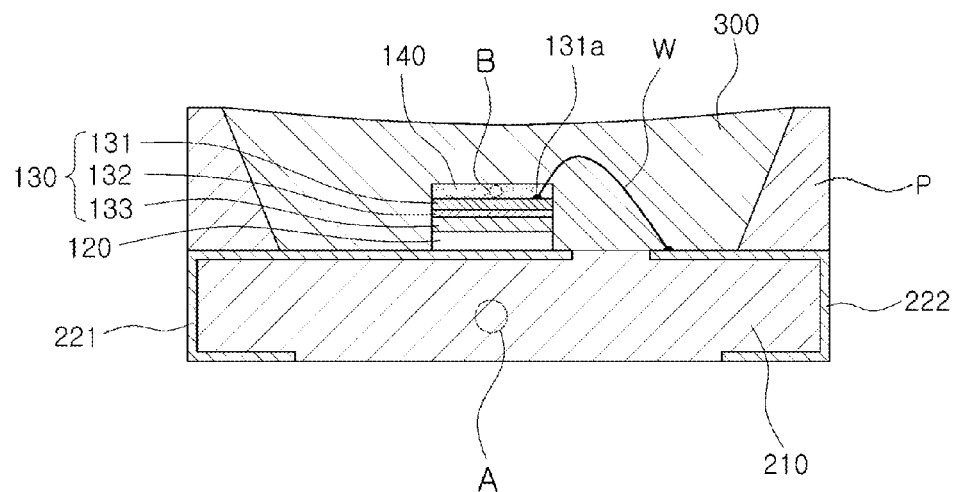
FIG. 1 is a cross-sectional view of a light emitting device and a light emitting device package according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a light emitting device and a light emitting device package according to example embodiments.

Referring to FIG. 1, a light emitting device package according to example embodiments may include a package body 210, first and second electrode structures 221 and 222, and a light emitting device electrically connected to the electrode structures 221 and 222.

The package body 210 is provided to support the light emitting device and the first and second electrode structures 221 and 222. The package body 210 according to example embodiments may include a resin as a basic material thereof and may include nanofibers and light-reflective powder particles dispersed in the resin.

The light emitting device may be a semiconductor light emitting device that emits light having a desired (or alternatively predetermined) wavelength due to an external electrical signal. For example, the light emitting device may include a light emitting laminate 130 including a first conductivity-type semiconductor layer 131, a second conductivity-type semiconductor layer 133, and an active layer 132 disposed therebetween.

In detail, the first conductivity-type semiconductor layer 131 and the second conductivity-type semiconductor layer 133 may be a p-type semiconductor layer and an n-type semiconductor layer, respectively, but example embodiments are not limited thereto and, conversely, the first conductivity-type semiconductor layer 131 and the second conductivity-type semiconductor layer 133 may be an n-type semiconductor layer and a p-type semiconductor layer, respectively. The first conductivity-type semiconductor layer 131 and the second conductivity-type semiconductor layer 133 may be nitride semiconductors. For example, the first and second conductive-type semiconductor layers 131 and 133 may be made of a material such as GaN, AlGaN, InGaN, AlGaInN, or the like, having an empirical formula $Al_xIn_yGa_{(1-x-y)}N$ (here, $0 \leq x \leq 1$, $0 \leq y \leq 1$, and $0 \leq x+y \leq 1$). The active layer 132 may be disposed between the first conductivity-type semiconductor layer 131 and the second conductivity-type semiconductor layer 133, and may emit light having a desired (or alternatively predetermined) level of energy according to electron-hole recombination. The active layer 132 may have a multiple quantum well (MQW) structure in which quantum well layers and quantum barrier layers are alternately laminated. For example, an InGaN/GaN or GaN/AlGaN structure may be used.

As shown in FIG. 1, according to example embodiments, the light emitting device may include the light emitting laminate 130 including the p-type semiconductor layer as a second conductivity-type semiconductor layer 133, the active layer 132, and the n-type semiconductor layer as a first conductivity-type semiconductor layer 131 sequentially disposed on the conductive substrate 120 and an electrode 131*a* formed on the n-type semiconductor layer 131, but example embodiments are not limited thereto and the light emitting device may be variously modified as described hereinafter.

The first and second electrode structures 221 and 222 are provided to apply driving power to the light emitting device. The first and second electrode structures 221 and 222 are spaced apart from one another such that they are not electrically short-circuited, and may be configured to apply driving power to the first conductivity-type semiconductor layer 131 and the second conductivity-type semiconductor layer 133 of the light emitting device, respectively. Also, as illustrated in FIG. 1, the first and second electrode structures 221 and 222 may extend from a region in which the first and second electrode structures 221 and 222 are electrically connected to the light emitting device, to a lower surface of the package body 210 and may be exposed from the lower surface of the package body 210.

The light emitting device package may further include an encapsulation unit 300 protecting the light emitting device from external impacts and contamination. The encapsulation unit 300 may cover and encapsulate the light emitting device, and may be formed to have a desired (or alternatively predetermined) shape in an upper portion of the light emitting device and cured with a conductive wire W attached thereto. Here, the encapsulation unit 300 may be made of a resin having a high degree of transparency to allow light generated by the light emitting device to pass therethrough with minimum loss.

Also, as illustrated in FIG. 1, the package body 210 may include a partition P surrounding the light emitting device, and in this case, light generated in the light emitting device and moving toward lateral surfaces thereof is reflected, enhancing luminance efficiency. The partition P may be made of the same materials as the package body 210, and may be coated with a reflective material (e.g., metal) on a surface facing the light emitting laminate P. However, example embodiments are not limited thereto.

Meanwhile, when driven, the package body 210 may emit a large amount of heat due to energy that is not converted into optical energy. Energy may be converted to heat instead of optical energy due to a defect, or the like.

The converted thermal energy may be transmitted to the components, e.g., the first and second electrode structures 221 and 222, the encapsulation unit 300, and the package body 210 of the light emitting device package, as well as to the light emitting device, and if a difference between coefficients of thermal expansion of the components constituting the light emitting device package is significant, a defective package may be formed.

For example, coefficients of thermal expansion of the light emitting device may be approximately 6 ppm/K and the first and second electrode structures 221 and 222 may be approximately 16 ppm/K, or less at temperatures from 20° C. to 150° C. corresponding to a substantial operating temperature range of the light emitting device package, respectively, which are different from a coefficient of thermal expansion of a basic material, e.g., an epoxy resin (100 ppm/K) or a silicone resin (200 ppm/K), used to form the package body 210, resulting in a defective package such as distortion of or cracks in the package body 210 or deformed or damaged electrode structures, or the like. In this connection, a method of mixing glass fibers in the resin has been proposed, but a coefficient of thermal expansion of the resin including glass fibers is tens of ppm/K, incapable of solving the problem of a defect due to a difference in coefficients of thermal expansion. Also, glass fibers, having a width ranging from 1 μm to 4 μm and a length ranging from 10 μm to 80 μm, may not be evenly dispersed in the resin and have inferior viscosity properties to cause the resin to agglomerate during a manufacturing process.

Thus, the package body 210 according to example embodiments includes nanofibers and light-reflective powder particles dispersed in the resin as a basic material. Materials constituting the package body 210 will be described in detail with reference to FIG. 2.

Figure 2:
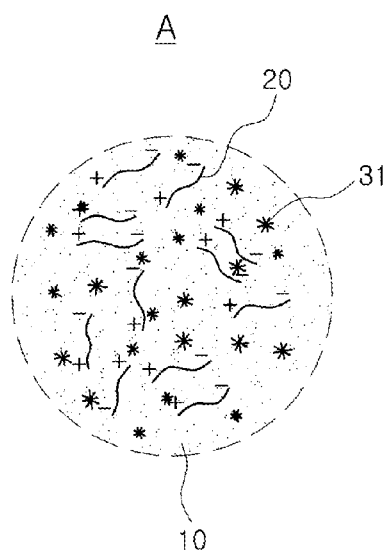
FIG. 2 is a view illustrating materials used to form a package body of a light emitting device package according to example embodiments.

FIG. 2 is a view illustrating materials used to form a package body of the light emitting device package according to example embodiments. Specifically, FIG. 2 is an enlarged view of region 'A' in FIG. 1.

Referring to FIG. 2, the package body 210 according to example embodiments may include a resin 10 as a basic material and nanofibers 20 and light-reflective powder particles 31 dispersed in the resin 10.

The resin 10 may be a material selected from among epoxy, silicone, modified silicone, a urethane resin, an oxetane resin, acryl, polycarbonate, polyimide, and any combination thereof.

The nanofibers 20 may include at least one of chitin and cellulose and may have a shape of a fiber having a width equal to or less than 80 nm and a length equal to or greater than 1 μm. For example, the nanofibers 20 may have a shape having a width ranging from 10 nm to 20 nm and a length ranging from 1 μm to 2 μm, but example embodiments are not limited thereto. Chitin and cellulose may be obtained from a carapace of a crustacean or wood pulp, and when the nanofibers 20 are appropriately mixed in the resin 10, the package body 210 may have a coefficient of thermal expansion similar to those of the other components included in the light emitting device package.

In detail, the nanofibers 20 may be dispersed to have the content ranging from 0.1% to 50% in the resin 10, based on weight ratio of the nanofibers to the resin, and in this case, the package body 210 made of the resin 10 with the nanofibers 20 dispersed therein may have a linear coefficient of thermal expansion ranging from 1 ppm/K to 20 ppm/K, for example, ranging from 4 ppm/K to 10 ppm/K, at a temperature ranging from 20° C. to 150° C. Also, optical properties of the resin 10 with the nanofibers 20 dispersed therein may be controlled by regulating the weight ratio of the nanofibers 20. For example, when the nanofibers 20 are dispersed in an amount of 0.1% to less than 1% in the resin 10, the mixture material may have transparent optical properties. When the nanofibers 20 are contained in an amount of 1% or more, for example, in an amount of 1% to 5%, based on weight ratio of the nanofibers to the resin, the mixture material may have opaque optical properties.

In the application of the resin to the package body 210 according to example embodiments, the package body 210 may be formed to have reflection characteristics to induce light emitted from the light emitting device to travel in a desired direction. In this case, the nanofibers 20 may be dispersed and contained in the amount of 1% to 5% in the resin, and in order to reinforce the reflection characteristics, the package body 210 may further include the light-reflective powder particles 31 dispersed in the mixture.

The light-reflective powder particles 31 may be contained in an amount of ranging from 20% to 80% in the resin 10 to enhance reflection characteristics, and may include a metal oxide such as titanium oxide ($TiO_2$) or aluminum oxide ($Al_2O_3$), for example. In other words, a weight ratio of the light-reflective powder particles 31 to the resin may range from about 20% to about 80%.

According to example embodiments, differences in coefficients of thermal expansion between and among the components included in the light emitting device package may be reduced and, in particular, a defective package due to the differences in coefficients of thermal expansion commonly generated in the surfaces in which the package body 210 and the first and second electrode structures 221 and 222 are in contact or the surface in which the package body 210 and the light emitting device are in contact can be significantly improved.

In addition, due to chiral separation characteristics of the nanofibers 20, opposite ends of the nanofibers 20 may be polarized, thus allowing the nanofibers 20 to be evenly dispersed in the resin 10. Also, due to chiral separation characteristics of the nanofibers 20, the viscosity of the resin 10 may be lowered, and thus, an agglomeration of the resin 10 during a process of forming the package body 210 can be effectively improved.

Hereinafter, the light emitting device having a wavelength conversion layer 140 according to example embodiments will be described in detail.

Referring back to FIG. 1, the light emitting device according to example embodiments may include the light emitting laminate 130 and the wavelength conversion layer 140 formed on the light emitting laminate 130.

The wavelength conversion layer 140 may be provided to obtain desired optical properties by converting a wavelength of light output from the light emitting laminate 130. The wavelength conversion layer 140 may include a light-transmissive resin as a basic material and a wavelength conversion material dispersed in the light-transmissive resin. The wavelength conversion material 32 may include at least one of phosphors and quantum dots excited by light emitted from the light emitting laminate 130 to emit light having a different wavelength.

The wavelength conversion layer 140 may have a thickness ranging from about 20 μm to 200 μm, and may be disposed such that one surface thereof is in direct contact with the light emitting laminate 130. In this case, the surface in which the wavelength conversion layer 140 and the light emitting laminate 130 are in direct contact may be a main light emitting surface of the light emitting laminate 130, e.g., an upper surface of the light emitting laminate 130. Namely, the wavelength conversion layer 140 may be provided as a thin film coated on or attached to the light emitting laminate 130, and may include a wavelength conversion material 32 evenly distributed therein.

Meanwhile, the upper surface of the light emitting laminate 130 in contact with the wavelength conversion layer 140 may be a surface of the conductivity-type semiconductor layer or may be one surface of a light-transmissive substrate in a case in which the light emitting laminate further includes the light-transmissive substrate. For example, when a GaN semiconductor layer is used as the conductivity-type semiconductor layer, or when a sapphire substrate is used as the light-transmissive substrate, the upper surface of the light emitting laminate 130 may have a coefficient of thermal expansion of approximately 6 ppm/K in a temperature ranging from 20° C. to 150° C.

Meanwhile, coefficients of thermal expansion of a light-transmissive resin, e.g., an epoxy resin or a silicone resin, used to form the wavelength conversion layer 140 are 100 ppm/K and 200 ppm/K, respectively, which are different from the light emitting laminate 130 in a contact surface therebetween. Thus, when the light emitting device is driven, the wavelength conversion layer 140 may be damaged, such as being deformed, or the like, degrading optical properties.

In particular, in a case in which the wavelength conversion layer 140 is implemented as a thin film having a thickness ranging from 20 μm to 200 μm for the purpose of an even distribution of the wavelength conversion material, a problem of a defective light emitting device may be further aggravated due to discrepancy between the coefficients of thermal expansion.

Thus, the wavelength conversion layer 140 according to example embodiments may further include nanofibers dispersed in the light-transmissive resin as a basic material of the wavelength conversion layer 140. This will be described in detail with reference to FIG. 3.

Figure 3:
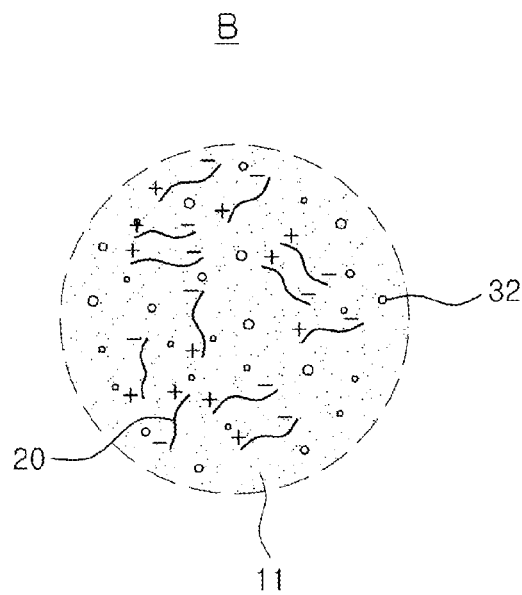
FIG. 3 is a view illustrating materials used to form a wavelength conversion layer of a light emitting device according to example embodiments.

FIG. 3 is a view illustrating materials used to form the wavelength conversion layer 140 of the light emitting device according to example embodiments. Specifically, FIG. 3 is an enlarged view of region 'B' in FIG. 1.

Referring to FIG. 3, the wavelength conversion layer 140 according to example embodiments includes a light-transmissive resin 11 as a basic material, and nanofibers 20 and a wavelength conversion material 32 dispersed in the light-transmissive resin 11. As shown in FIG. 3, at least some of the nanofibers 20 are spaced apart from at least some of the wavelength conversion material 32.

The light-transmissive resin 11 may be a material selected from among epoxy, silicone, modified silicone, a urethane resin, an oxetane resin, acryl, polycarbonate, polyimide, and any combination thereof. The wavelength conversion material 32 may be contained in the amount of 50% to 300% in the light-transmissive resin 11. In other words, a weight ratio of the wavelength conversion material 32 to the light-transmissive resin 11 may range from about 50% to about 300%. However, example embodiments are not limited thereto.

Like the package body 210, the nanofibers 20 may include at least one of chitin and cellulose and may have a shape of fiber having a width equal to or less than 80 nm and a length equal to or greater than 1 μm and/or ranging from 1 μm to 2 μm. For example, the nanofibers 20 may have a width ranging from 10 nm to 20 nm. Since the width of the nanofibers 20 may be less than one-tenth of 300 nm to 800 nm as a wavelength range of visible light, light loss when the nanofibers 20 are mixed in the light-transmissive resin 11 can be reduced (and/or minimized).

The nanofibers 20 may be dispersed to have a content ranging from 0.1% to 1% in the light-transmissive resin 11. In other words, a weight ratio of the nanofibers 20 to the resin 11 may range from 0.1% to less than 1%. In this case, the light-transmissive resin 11 with the nanofibers 20 dispersed therein may have light transmittance equal to or greater than 90% and a linear coefficient of thermal expansion ranging from 1 ppm/K to 20 ppm/K. For example, the light-transmissive resin 11 with the nanofibers 20 may have a linear coefficient of thermal expansion ranging from 4 ppm/K to 10 ppm/K, at a temperature ranging from 20° C. to 150° C. Namely, in a light emitting device according to example embodiments, since the difference in coefficients of thermal expansion in a surfaces of contact between the wavelength conversion layer 140 and the light emitting laminate 130 is significantly reduced, a problem of damage to the wavelength conversion layer 140 due to heat when the light emitting device is driven can be effectively improved.

Hereinafter, a method for obtaining the nanofibers 20 dispersed in the package body 210 and the wavelength conversion layer 140 and a method for manufacturing the light emitting device and the light emitting device package including the wavelength conversion layer 140 according to example embodiments will be described in detail.

Figure 4:
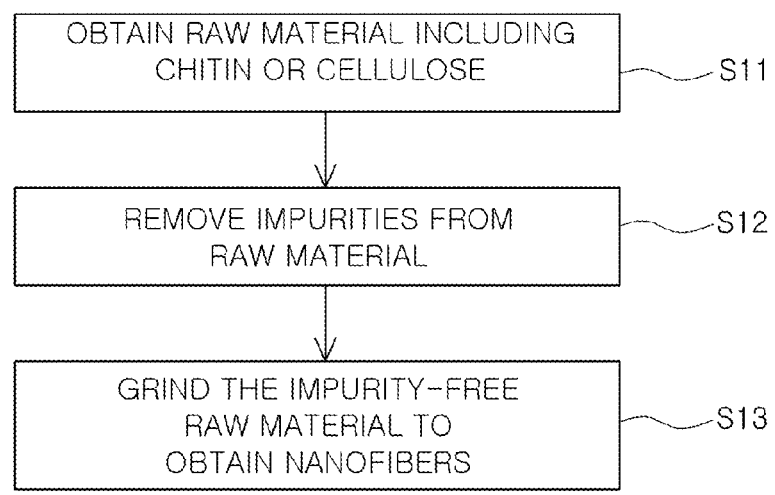
FIG. 4 is a flow chart illustrating a method for manufacturing nanofibers to form a light emitting device package and a wavelength conversion layer according to example embodiments.

FIG. 4 is a flow chart illustrating a method for obtaining the nanofibers 20 according to example embodiments.

Referring to FIG. 4, a method for obtaining the nanofibers 20 according to example embodiments starts from operation S11 of obtaining a raw material including chitin or cellulose. The raw material including chitin may be obtained from a carapace of a crustacean (e.g., a crab shell), and a raw material including cellulose may be obtained from a natural organic compound such as wood pulp, or the like.

Next, impurities in the raw material are removed (S12). During this process, impurities, e.g., proteins, salts, pigments, lipids, and the like, included in the raw material, are removed by applying an acid (HCl), a base (NaOH), and ethanol thereto.

Thereafter, the raw material without impurities is ground to obtain the nanofibers 20 (S13). In this process, the raw materials without impurities may be ground by using a grinder, or the like.

FIGS. 5A through 6C are cross-sectional views illustrating desired (or alternatively predetermined) of a method for manufacturing the light emitting device including the wavelength conversion layer 140 according to example embodiments.

Figure 5A:
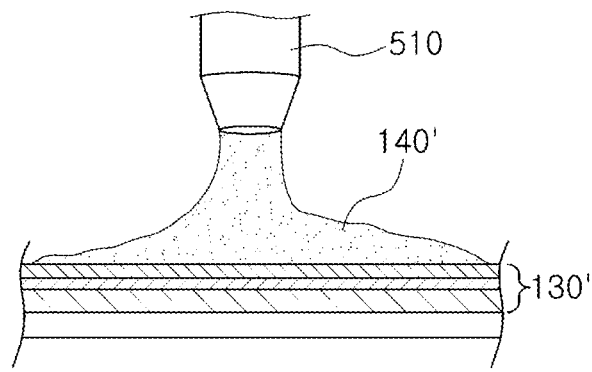
FIGS. 5A through 6C are cross-sectional views illustrating a method for manufacturing a light emitting device according to example embodiments.

First, referring to FIG. 5A, a wavelength conversion layer 140' may be coated on a light emitting laminate 130' on the wafer level before being cut into individual device units, by using a dispenser 510, or the like. In detail, at least one dispensing method including a pneumatic dispensing method, a mechanical dispensing method, and a jetting dispensing method able to be controlled to emit a small amount of the wavelength conversion layer 140' may be used. Alternatively, a process such as screen printing, a spraying process, or the like, that may be comprehensively applied to a large amount of products may be used.

Figure 5B:
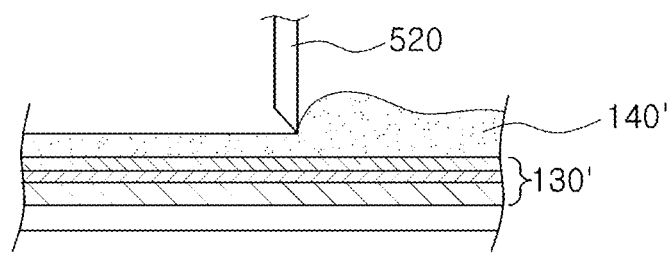
Figure 5C:
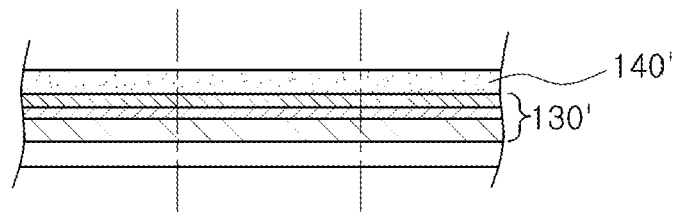

In the case of using the mechanical dispensing method, for example, as illustrated in FIG. 5B, a squeegee 520 is pushed on a surface of the wavelength conversion layer 140' from one end to the other end thereof to allow the wavelength conversion layer 140' to have a uniform (or substantially uniform) thickness, and through a follow-up curing process, the wavelength conversion layer 140' may be cured on the light emitting laminate 130' on the wafer level. Thereafter, as illustrated in FIG. 5C, the light emitting laminate 130' on the wafer level with the wavelength conversion layer 140' coated thereon may be cut into individual device units to manufacture a light emitting device according to example embodiments.

However, example embodiments are not limited thereto and the wavelength conversion layer 140 may be formed such that it is coated on the light emitting laminate 130 cut into individual device units. Also, unlike the method of coating the wavelength conversion layer 140 on the light emitting laminate 130, a wavelength conversion layer 140 may be separately formed and may be subsequently attached to the light emitting laminate 130.

Figure 6A:
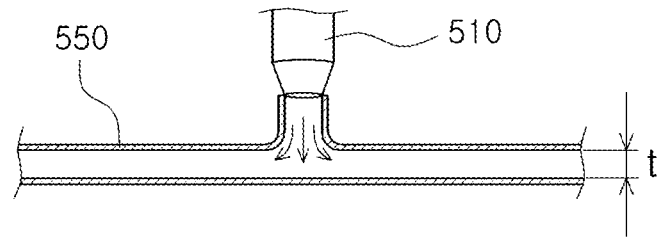
Figure 6B:
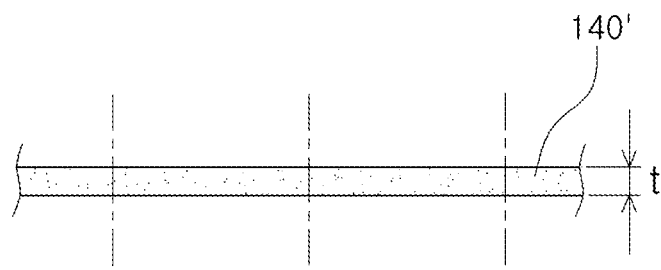
Figure 6C:
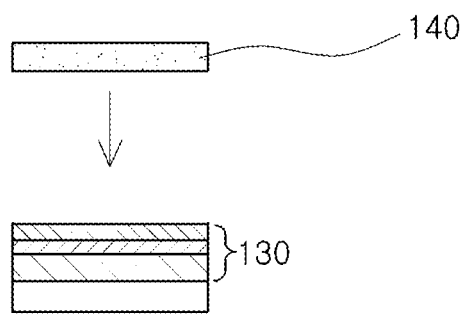

In detail, referring to FIG. 6A, the wavelength conversion layer 140' may be injected into a rack 550 by using a dispenser 510 such that it has a desired thickness t. Thereafter, as illustrated in FIG. 6B, the wavelength conversion layer 140' injected into the rack 550 is cured, and when the curing process is completed, the rack 550 is removed and the wavelength conversion layer 140' is cut into individual wavelength conversion layer units that may be attached to each light emitting laminate 130. Thereafter, as illustrated in FIG. 6C, the cut individual wavelength conversion layer 140 is attached to the light emitting laminate 130, thus manufacturing a light emitting device.

Example embodiments are not limited to the foregoing manufacturing method and various modifications may be employed. For example, before being cut into individual units, the wavelength conversion layer 140' may be first attached to the light emitting laminate 130' on the wafer level and the light emitting laminate 130' on the wafer level, with the wavelength conversion layer 140' attached thereto, may be subsequently cut into individual light emitting device units. For example, electrophoresis or a conformal coating process may be used for local coating in a particular region such as an upper surface of the light emitting laminate.

FIGS. 7A through 7D are cross-sectional views illustrating desired (or alternatively predetermined) of a method for manufacturing a light emitting device package according to example embodiments.

Figure 7A:
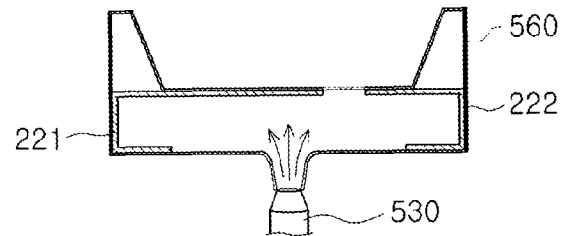
FIGS. 7A through 7D are cross-sectional views illustrating a method for manufacturing a light emitting device package according to example embodiments.

Referring to FIG. 7A, a material for forming the package body 210 is injected into the rack 560 in which the first and second electrode structures 221 and 222 are positioned, by using a dispenser 530, or the like. The material for forming the package body 210 may be a mixture of the resin 10 as a basic material and the nanofibers 20 and the light-reflective powder particles 31 dispersed in the resin 10. The rack 560 may be prepared to have a desired shape of the light emitting device package.

Meanwhile, unlike the case of using only the resin 10 as a material used to form the package body 210, mixing of the nanofibers 20 having a width equal to or less than 80 nm and a length ranging from about 1 μm to 2 μm may lower viscosity due to the chiral separation characteristics of the nanofibers 20. Namely, according to example embodiments, while the package body 210 is being formed, clumping or agglomeration of materials constituting the package body 210 within an inlet of the dispenser 530 or within the rack 560 can be effectively improved, and thus, the light emitting device package having a precisely formed structure can be manufactured.

Figure 7B:
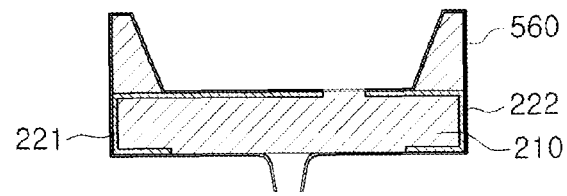

Thereafter, as illustrated in FIG. 7B, when the process of injecting the material for forming the package body 210 into the rack 560 is completed, the material is cured and, when the curing process is completed, the rack 560 is removed.

Figure 7C:
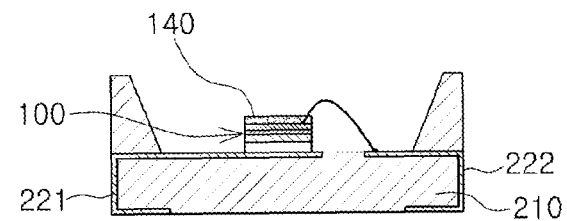

FIG. 7C illustrates a state in which the light emitting device 100 is disposed on the package body 210 after the rack 560 is removed. The light emitting device 100 may be disposed to be contiguous with the first electrode structure 221 and wire-bonded to the second electrode structure 222, thus receiving driving power from the first and second electrode structures 221 and 222, but example embodiments are not limited thereto.

Figure 7D:
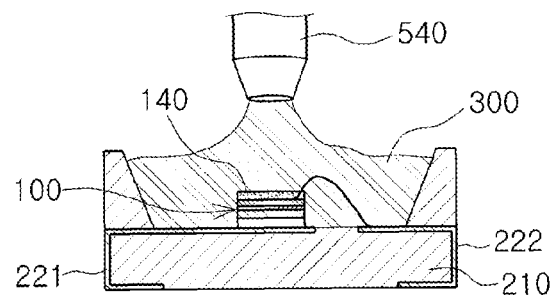

Thereafter, as illustrated in FIG. 7D, the encapsulation unit 300 may be formed on the package body 210. The encapsulation unit 300 may be coated on the package body 210 by using the dispenser 540 and subsequently cured so as to be completed.

Figure 8:
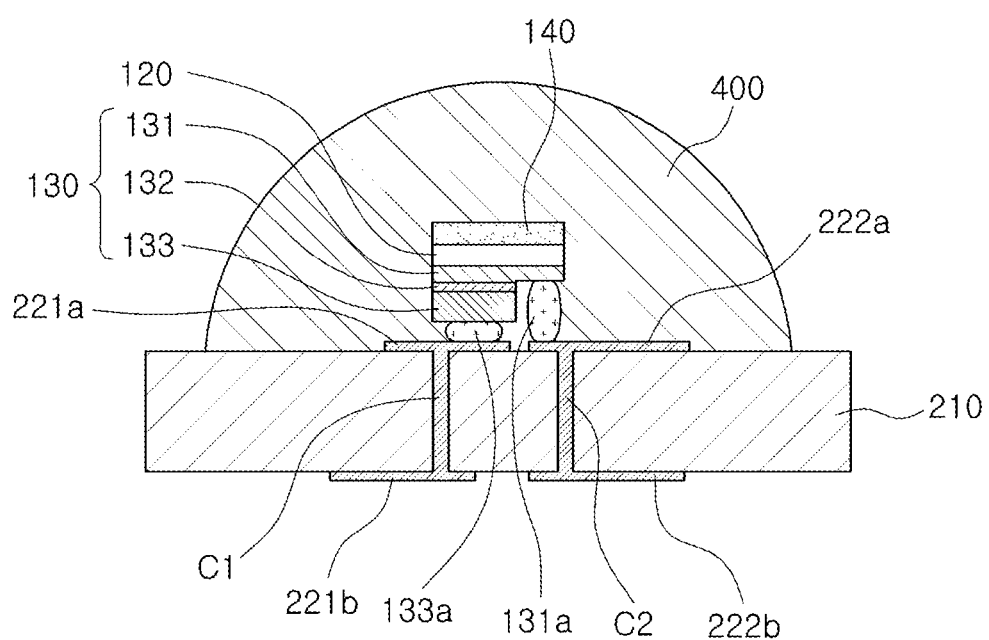
FIG. 8 is a cross-sectional view of a light emitting device and a light emitting device package according to example embodiments.

FIG. 8 is a cross-sectional view of a light emitting device and a light emitting device package according to example embodiments.

First, the light emitting device package includes the package body 210 having the resin 10 and the nanofibers 20 and the light-reflective powder particles 31 dispersed in the resin 10, first and second electrode structures, and a light emitting device disposed on package body 210 and electrically connected to the first and second electrode structures.

The light emitting device is illustrated to have the wavelength conversion layer 140, but it is not limited thereto. Namely, the light emitting device without the wavelength conversion layer 140 may also be provided.

Here, the first and second electrode structures may include conductive vias C1 and C2 and surface electrodes 221a and 222a and rear electrodes 221b and 222b formed on upper and lower surfaces of the package body 210 and electrically connected to conductive vias C1 and C2.

The first and second electrode structures may be a made of a conductive material, e.g., a material selected from the group consisting of silver (Ag), aluminum (Al), titanium (Ti), tungsten (W), copper (Cu), tin (Sn), nickel (Ni), platinum (Pt), chromium (Cr), NiSn, TiW, AuSn, and a eutectic metal thereof, and in this case, a coefficient of thermal expansion thereof may have a value equal or less than approximately 16 ppm/K. Here, when the nanofibers 20 are contained in an amount of 1% to 50%, preferably, in an amount of about 1% to 5% in the resin 10, as a basic material of the package body 210, differences in the coefficients of thermal expansion between the package body 210 and other components, e.g., the light emitting device, the first and second electrode structures 221a, 222a, 221b and 222b, and the like, included in the light emitting device package are significantly reduced, and thus, a defective package problem due to heating when the light emitting device is driven can be effectively mitigated.

Also, the light emitting device package may include an encapsulation unit 400 formed on the package body 210, and here, the encapsulation unit 400 may have a lens shape in order to control an angle of beam spread of light output from the light emitting device.

Meanwhile, as described above, the light emitting device may include the light emitting laminate 130 and the wavelength conversion layer 140 formed on the light emitting laminate 130. The wavelength conversion layer 140 includes a light-transmissive resin 11 as a basic material, and the nanofibers 20 and the wavelength conversion material 32 dispersed in the resin 11.

However, unlike FIG. 1, in example embodiments, the light emitting laminate 130 includes an insulating substrate 120 and is mounted such that the first and second electrodes 131a and 133a formed on the first and second conductivity-type semiconductor layers 131 and 133 face downwardly. Here, a main light emitting surface of the light emitting laminate 130 is an upper surface of the insulating substrate 120, and the wavelength conversion layer 140 is formed to be directly contiguous with the insulating substrate 120.

In a case in which a sapphire substrate is employed as the insulating substrate 120, a coefficient of thermal expansion of the insulating substrate 120 is approximately 6 ppm/K and that of the wavelength conversion layer 140 may range from 4 ppm/K to 10 ppm/K when the nanofibers 20 are contained in the amount of 0.1% to less than 1% in the light-transmissive resin 11 as a basic material of the wavelength conversion layer 140. Thus, damage such as deformation of the wavelength conversion layer 140 due to heating of the light emitting device in an interface in which the light emitting laminate 130 and the wavelength conversion layer 140 are in contact can be significantly reduced.

Meanwhile, example embodiments are not limited thereto, and the insulating substrate 120 may be removed from the light emitting device and the wavelength conversion layer 140 may be formed to be in contact with the first conductivity-type semiconductor layer 131. Here, the upper surface of the first conductivity-type semiconductor layer may have depressions and protrusions and, in this case, external quantum efficiency can be increased and a junction area of the first conductivity-type semiconductor layer 131 with respect to the wavelength conversion layer 140 can be increased, improving adhesive force.

Also, in FIG. 8, the light emitting device is illustrated to be disposed on the light emitting device package including the package body 210 in which the nanofibers 20 are dispersed in the resin 10, but example embodiments are not limited thereto and the light emitting device may be used in form of being directly mounted on a Printed Circuit Board (PCB) and it is obvious that the light emitting device is disposed on the package body 210 not containing the nanofibers 200 so as to be used.

FIGS. 9A through 9E are cross-sectional views illustrating a method for manufacturing a light emitting device package according to example embodiments.

Figure 9A:
FIGS. 9A through 9E are cross-sectional views illustrating a method for manufacturing a light emitting device package according to example embodiments.
Figure 9B:
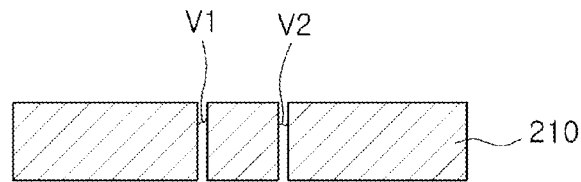

Referring to FIG. 9A, the package body 210 having the resin 10 and the nanofibers 20 and the light-reflective powder particles 31 dispersed in the resin 100. Next, as illustrated in FIG. 9B, through holes V1 and V2 may be formed to penetrate through the package body 210. The through holes V1 and V2 are formed to form first and second conductive vias C1 and C2, and here, at least a pair of through holes V1 and V2 may be formed. The through holes V1 and V2 may be formed by using an etching process using a mask.

Figure 9C:
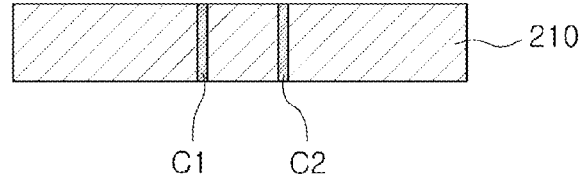

Thereafter, referring to FIG. 9C, the interiors of the through holes V1 and V2 are filled with a conductive material to form the first and second conductive vias C1 and C2, and thus, an upper surface and a lower surface of the package body 210 may be electrically connected through the conductive vias C1 and C2. The first and second conductive vias C1 and C2 may be formed through injection, spreading, plating, or the like.

Figure 9D:
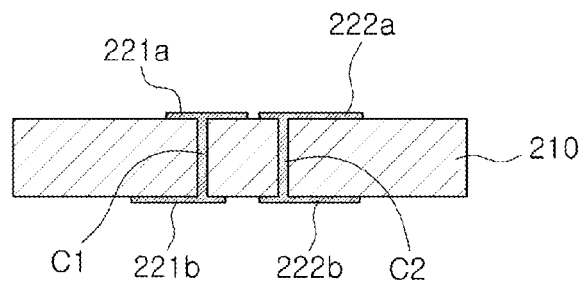
Figure 9E:
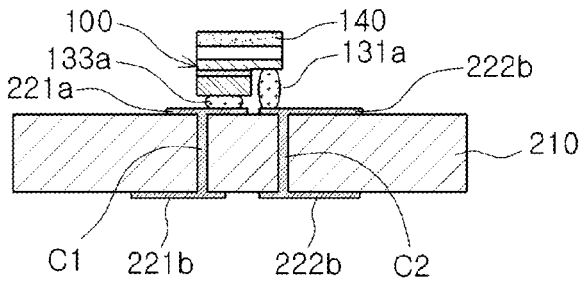

Thereafter, as illustrated in FIG. 9D, the first surface electrodes 221a and 222a and the first and second rear electrodes 221b and 222b are formed on the upper surface and the lower surface of the package body 210, respectively. The surface electrodes 221a and 222a and the rear electrodes 221b and 222b may be electrically connected by the conductive vias C1 and C2, and as illustrated in FIG. 9E, the light emitting device 100 may be disposed on the first and second surface electrodes 221a and 222a. Here, the first and second electrodes 131a and 133a of the light emitting device 100 may be electrically connected to the first and second surface electrodes 221a and 222a, respectively. Thereafter, the encapsulation unit 400 is coated on the package body 210 to manufacture the light emitting device package as illustrated in FIG. 8.

Figure 10:
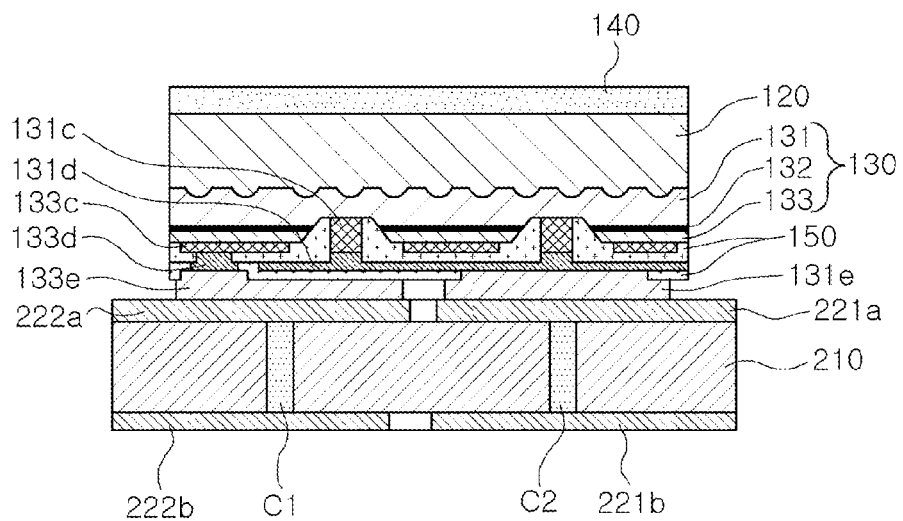
FIG. 10 is a cross-sectional view of a light emitting device and a light emitting device package according to example embodiments.

FIG. 10 is a cross-sectional view of a light emitting device and a light emitting device package according to example embodiments.

Referring to FIG. 10, a light emitting device according to example embodiments is mounted on a package body, which is configured to be different from the example as described above.

The light emitting device includes the light emitting laminate 130 disposed on one surface of the substrate 120 and first and second electrodes 131c and 133c disposed in the opposite side of the substrate 120 based on the light emitting laminate 130. Also, the light emitting device includes an insulating layer 150 formed to cover the first and second electrodes 131c and 133c. The first and second electrodes 131c and 133c may be connected to first and second electrode pads 131e and 133e by the first and second electrical connection portions 131d and 131d, respectively.

Here, a wavelength conversion layer 140 is formed on an upper surface of the substrate 120 provided as a light emitting surface. The wavelength conversion layer 140 may include a light-transmissive resin as a basic material thereof and nanofibers and a wavelength conversion material dispersed therein.

The light emitting laminate 130 may include the first conductivity-type semiconductor layer 131, the active layer 132, and the second conductivity-type semiconductor layer 133 sequentially disposed on the substrate 120. The first electrode 131c may be provided as a conductive via connected to the first conductivity-type semiconductor layer 131 through the second conductivity-type semiconductor layer 133 and the active layer 132. The second electrode 133C may be connected to the second conductivity-type semiconductor layer 133.

The insulating layer 150 has an open area exposing at least portions of the first and second electrodes 131c and 133c, and the first and second electrode pads 131e and 133e may be connected to the first and second electrodes 131c and 133c.

The first and second electrodes 131c and 133c may have a multilayer structure in which one or a plurality of layers made of a conductive material having ohmic characteristics with respect to the first conductivity-type semiconductor layers 131 and 133, respectively, are formed. For example, the first and second electrodes 131c and 133c may be formed by depositing or sputtering one or more of silver (Ag), aluminum (Al), nickel (Ni), chromium (Cr), a transparent conductive oxide (TCO), and the like. The first and second electrodes 131c and 133c may be disposed in the same direction and may be mounted as a so-called flip-chip on a lead frame as described hereinafter. In this case, the first and second electrodes 131c and 133c may be disposed to face in the same direction.

In particular, the first electrical connection portion 131d may be formed on the first electrode 131c having a conductive via connected to the first conductivity-type semiconductor layer 131 by passing through the second conductivity-type semiconductor layer 133 and the active layer 132 within the light emitting laminate 130.

The amount, a shape, a pitch, a contact area with the first conductivity-type semiconductor layer 131, and the like, of the conductive via and the first electrical connection portion 131d may be appropriately regulated in order to lower contact resistance, and the conductive via and the first electrical connection portion 131d may be arranged in a row and in a column to improve current flow.

Another electrode structure may include the second electrode 133c directly formed on the second conductivity-type semiconductor layer 133 and the second electrical connection portion 133d formed on the second electrode 133c. In addition to having a function of forming an electrical-ohmic connection with the second conductivity-type semiconductor layer 133, the second electrode 133c may be made of a light reflective material, whereby, as illustrated in FIG. 10, in a state in which the light emitting device is mounted as a so-called flip chip structure, light emitted from the active layer 132 can be effectively emitted in a direction of the substrate 120. Of course, the second electrode 133c may be made of a light-transmissive conductive material such as a transparent conductive oxide, according to a main light emitting direction.

The two electrode structures as described above may be electrically separated by the insulating layer 150. The insulating layer 150 may be made of any material as long as it has electrically insulating properties. Namely, the insulating layer 150 may be made of any material having electrically insulating properties, and here, preferably, a material having a low degree of light absorption is used. For example, a silicon oxide or a silicon nitride such as $SiO_2$, $SiO_xN_y$, $Si_xN_y$, or the like, may be used. If necessary, a light reflective filler may be dispersed in the light-transmissive material to form a light reflective structure.

The first and second electrode pads 131e and 133e may be connected to the first and second electrical connection portions 131d and 133d to serve as external terminals of the light emitting device, respectively. For example, the first and second electrode pads 131e and 133e may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the light emitting device is mounted on the mounting substrate 120, the light emitting device may be bonded by using a eutectic metal, so solder bumps generally required for flip chip bonding may not be used. The use of a eutectic metal advantageously obtains superior heat dissipation effects in the mounting method to the case of using solder bumps. In this case, in order to obtain excellent heat dissipation effects, the first and second electrode pads 131e and 133e may be formed to occupy a relatively large area.

Also, a buffer layer may be formed between the light emitting structure 130 and the substrate 120. The buffer layer may be employed as an undoped semiconductor layer made of a nitride, or the like, to alleviate lattice defects in the light emitting structure grown thereon.

In example embodiments, the substrate 120 may have first and second main surfaces opposing one another, and an unevenness structure (i.e., a pattern of depressions and protrusions) may be formed on at least one of the first and second main surfaces. The unevenness structure formed on one surface of the substrate 120 may be formed by etching a portion of the substrate 120 so as to be made of the same material as that of the substrate. Alternatively, the unevenness structure may be made of a heterogeneous material different from that of the substrate 120.

In example embodiments, since the unevenness structure is formed on the interface between the substrate 120 and the first conductivity-type semiconductor layer 131, light emitted from the active layer 132 can be emitted on a variety of paths, and thus, a light absorption ratio of light absorbed within the semiconductor layer can be reduced and a light scattering ratio can be increased, increasing light extraction efficiency.

In detail, the unevenness structure may be formed to have a regular or irregular shape. The heterogeneous material used to form the unevenness structure may be a transparent conductor, a transparent insulator, or a material having excellent reflectivity. Here, as the transparent insulator, a material such as $SiO_2$, SiNx, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, or Sn), or the like, may be used. As the reflective material, silver (Ag), aluminum (Al), or a distributed Bragg reflector (DBR) including multiple layers having different refractive indices, may be used. However, example embodiments are not limited thereto.

Meanwhile, the substrate 120 may be removed from the first conductivity-type semiconductor layer 131. To remove the substrate 120, a laser lift-off (LLO) process using a laser, an etching or a polishing process may be used. Also, after the substrate 120 is removed, depressions and protrusions may be formed on the surface of the first conductivity-type semiconductor layer 131.

As illustrated in FIG. 10, the light emitting device may be mounted on the package body 210. The package body 210 includes the surface electrodes 221a and 222a and the rear electrodes 221b and 222b formed on the upper and lower surfaces thereof, and the conductive vias C1 and C2 connecting the surface electrodes 221a and 222a and the rear electrodes 221b and 222b. The package body 120 may include a resin as a basic material and include nanofibers and light-reflective powder particles dispersed in the resin.

Hereinafter, various modifications of the light emitting device installed in a light emitting device package according to example embodiments are described.

Figure 11:
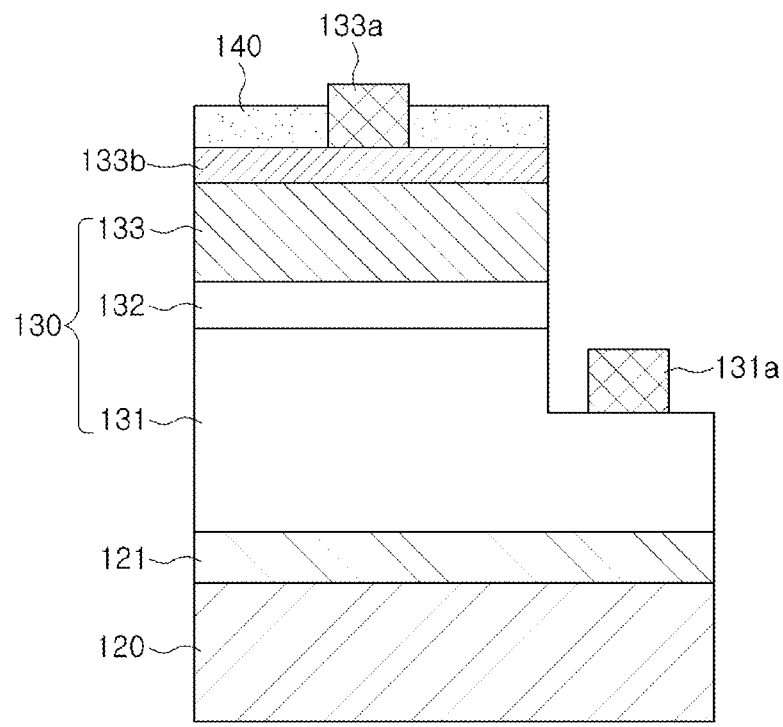
FIGS. 11 through 13 are cross-sectional views illustrating a light emitting device installed in a light emitting device package according to example embodiments.
Figure 12:
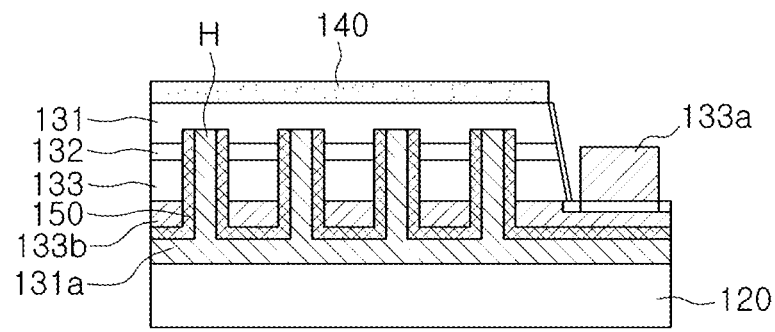
Figure 13:
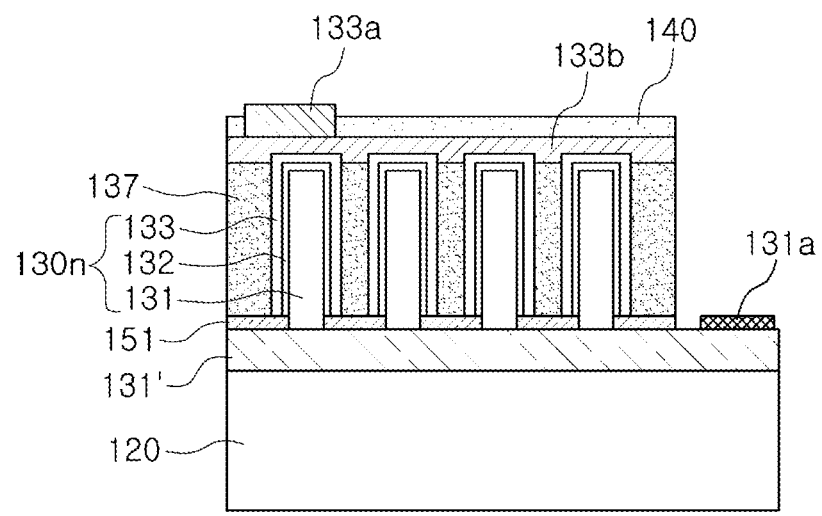

FIGS. 11 through 13 are cross-sectional views illustrating a light emitting device installed in a light emitting device package according to example embodiments;

First, referring to FIG. 11, the light emitting device employed in a semiconductor light emitting device package according to example embodiments includes the substrate 120 and the light emitting laminate 130 formed on the substrate 120.

As the substrate 120, an insulating substrate, a conductive substrate, or a semiconductor substrate may be used. For example, the substrate 120 may be made of sapphire, SiC, Si, $MgAl_2O_4$, MgO, $LiAlO_2$, $LiGaO_2$, GaN, AlN, AlGaN. For epitaxial growth of a GaN material, a GaN substrate as a homogeneous substrate may be desirable but it is difficult to manufacture a GaN substrate, incurring high production costs. Among them, a sapphire substrate, a silicon carbide (SiC) substrate, or the like, is commonly used as a heterogeneous substrate, and a sapphire substrate is more commonly utilized, relative to a costly silicon carbide substrate. In the case of a sapphire substrate, sapphire is a crystal having Hexa-Rhombo R3c symmetry, of which lattice constants in c-axis and a-axis directions are approximately 13.001 Å and 4.758 Å, respectively, and has a C-plane (0001), an A-plane (1120), an R-plane (1102), and the like. In this case, a nitride thin film may be relatively easily grown on the C-plane of the sapphire crystal, and because sapphire crystal is stable at high temperatures, the sapphire substrate is commonly used as a nitride growth substrate.

A silicon (Si) substrate may also be used. Since a silicon (Si) substrate is more appropriate for increasing a diameter and is relatively low in price, it may be used to facilitate mass-production. A technique of inducing a difference in lattice constants between the silicon substrate having (111) plane as a substrate surface and GaN to a 17% degree to thereby suppress the generation of crystal defects due to the difference between the lattice constants is required. Also, a difference in coefficients of thermal expansion between silicon and GaN is approximately 56%, requiring a technique of suppressing bowing of a wafer generated due to the difference in the coefficients of thermal expansion. Bowed wafers may result in cracks in the GaN thin film and make it difficult to control processes to increase dispersion of emission wavelengths of light in the same wafer, or the like. The silicon substrate absorbs light generated in the GaN-based semiconductor, lowering external quantum yield of the light emitting device. Thus, the substrate may be removed and a support substrate such as a silicon substrate, a germanium substrate, an SiAl substrate, a ceramic substrate, a metal substrate, or the like, including a reflective layer may be additionally formed to be used, as necessary.

Meanwhile, in case of using a heterogeneous substrate, defects such as dislocation due to a difference in lattice constants between a substrate material and a thin film material. Also, a difference in coefficients of thermal expansion between the substrate material and the thin film material causes bowing of the substrate when a temperature is changed, and bowing in the substrate causes cracks in the thin film. These problems may be reduced by using a buffer layer 121 formed between the substrate 120 and the GaN-based light emitting laminate 130.

Thus, the light emitting device according to example embodiments further includes the buffer layer 121 formed between the substrate 120 and the light emitting laminate 130. The buffer layer 121 may serve to adjust a degree of bowing of the substrate when an active layer is grown, to reduce wavelength distribution of a wafer.

Although differs according to a substrate type, the buffer layer 121 may be made of $Al_xIn_yGa_{1-x-y}N$ (0≤x≤1, 0≤y≤1), in particular, GaN, AlN, AlGaN, InGaN, or InGaAlN, and a material such as $ZrB_2$, $HfB_2$, ZrN, HfN, TiN, or the like, may also be used as necessary. Also, the buffer layer 121 may be formed by combining a plurality of layers or by gradually changing a composition.

Meanwhile, a silicon (Si) substrate has a coefficient of thermal expansion significantly different from that of GaN. Thus, in case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to limit (and/or prevent) the generation of cracks, a method of growing the GaN thin film such that compressive stress is applied to the GaN thin film while the GaN thin film is being grown is used to compensate for tensile stress. Also, a difference in the lattice constants between silicon (Si) and GaN involves a high possibility of a defect being generated therein. In the case of a silicon substrate, a buffer layer having a composite structure may be used in order to control stress for restraining warpage (or bowing) as well as controlling a defect.

For example, first, an AlN layer is formed on the substrate 120. In this case, a material not including gallium (Ga) may be used in order to limit (and/or prevent) a reaction between silicon (Si) and gallium (Ga). The AlN layer is grown at a temperature ranging from 400° C. to 1,300° C. by using an aluminum (Al) source and a nitrogen (N) source. In this case, an AlGaN intermediate layer may be inserted into the center of GaN between the plurality of AlN layers to control stress, as necessary, thus forming a buffer layer having a composite structure.

Meanwhile, the substrate 120 may be completely or partially removed or patterned during a chip fabrication process in order to enhance light or electrical characteristics of the LED chip before or after the LED structure is grown. For example, in the case of a sapphire substrate, the substrate may be separated by irradiating a laser on an interface between the substrate and a semiconductor layer through the substrate, and in case of a silicon substrate or a silicon carbide substrate, the substrate may be removed through a method of polishing/etching, or the like.

Also, in removing the substrate, a different support substrate may be used, and in this case, the support substrate may be attached to the opposite side of the original growth substrate by using a reflective metal or a reflective structure may be inserted into a middle portion of a bonding layer to enhance light efficiency of the LED chip.

Referring to substrate patterning, an uneven surface or a sloped surface may be formed on a main surface (one surface or both surfaces) or a lateral surface of the substrate to enhance light extraction efficiency. A size of the pattern may be selected from within the range of 5 nm to 500 μm, and any pattern may be employed as long as it can enhance light extraction efficiency as a regular or an irregular pattern. The pattern may have various shapes such as a columnar shape, a peaked shape, a hemispherical shape, a polygonal shape, and the like.

The light emitting laminate 130 includes the first and second conductivity-type semiconductor layers 131 and 133 and the active layer 132 interposed therebetween. The first and second conductivity-type semiconductor layers 131 and 133 may have a unilayer structure, or, alternatively, the first and second conductivity-type semiconductor layers 131 and 133 may have a multilayer structure including layers having different compositions, thicknesses, and the like, as necessary. For example, the first and second conductivity-type semiconductor layers 131 and 133 may have a carrier injection layer for improving electron and hole injection efficiency, or may have various types of superlattice structure, respectively.

The first conductivity-type semiconductor layer 131 may further include a current diffusion layer in a region adjacent to the active layer 132. The current diffusion layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 133 may further include an electron blocking layer in a region adjacent to the active layer 132. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 132, thus limiting (and/or preventing) electrons from being transferred over the second conductivity-type (e.g., p-type) semiconductor layer 133.

The light emitting laminate 130 may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 1401 is installed as reactive gases, the substrate is maintained at a high temperature ranging from 900° C. to 1,100° C., and while a gallium nitride-based compound semiconductor is being grown, an impurity gas is supplied to laminate the gallium nitride-based compound semiconductor as an undoped n-type or p-type semiconductor. The n-type impurity may be silicon (Si), but example embodiments are not limited thereto. The p-type impurity may include at least one of zinc (Zn), cadmium (Cd), beryllium (Be), magnesium (Mg), calcium (Ca), barium (Ba), and the like. Among them, magnesium (Mg) and zinc (Zn) may be more commonly used.

Also, the active layer 132 disposed between the first and second conductivity-type semiconductor layers 131 and 133 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

In example embodiments, an ohmic-contact layer 133b may be formed on the second conductivity-type semiconductor layer 133. The ohmic-contact layer 133b may have a relatively high impurity concentration to have low ohmic-contact resistance to lower an operating voltage of the element and enhance element characteristics. The ohmic-contact layer 133b may be formed of a GaN layer, a InGaN layer, a ZnO layer, or a graphene layer.

The first or second electrodes 131a and 133a electrically connected to the first and second conductivity-type semiconductor layers 131 and 133, respectively, may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag. Ir/Au, Pt/Ag, Pt/Al, Ni/Ag/Pt, or the like.

In example embodiments, an upper surface of the ohmic-contact layer 133b is provided as a light emitting surface of the light emitting device. In this case, the wavelength conversion layer 140 may be formed on the ohmic-contact layer 133b. The wavelength conversion layer 140 may include a light-transmissive resin as a basic material constituting the wavelength conversion layer 140 and nanofibers and a wavelength conversion material dispersed in the light-transmissive resin.

FIG. 12 illustrates a different type light emitting device applied to a semiconductor light emitting device package according to example embodiments. In particular, in case of manufacturing a large light emitting device for a high output, the light emitting device according to example embodiments may be employed as a structure for enhancing current spreading efficiency and heat dissipation efficiency.

As illustrated in FIG. 12, the light emitting device according to example embodiments may include the first conductivity-type semiconductor layer 131, the active layer 132, the second conductivity-type semiconductor layer 133, a second electrode layer 133b, the insulating layer 150, a first electrode layer 131a, and the substrate 120 sequentially laminated. Here, in order to be electrically connected to the first conductivity-type semiconductor layer 131, the first electrode layer 131a includes one or more contact holes H extending from one surface of the first electrode layer 131a to at least a partial region of the first conductivity-type semiconductor layer 131 and electrically insulated from the second conductivity-type semiconductor layer 133 and the active layer 132. However, the first electrode layer 131a is not an essential element in example embodiments.

The contact hole H extends from an interface of the first electrode layer 131a, passing through the second electrode layer 133b, the second conductivity-type semiconductor layer 133, and the first active layer 132, to the interior of the first conductivity-type semiconductor layer 131. The contact hole H extends to at least an interface between the active layer 132 and the first conductivity-type semiconductor layer 131, and preferably, extends to a portion of the first conductivity-type semiconductor layer 131. However, the contact hole H is formed for electrical connectivity and current spreading, so the purpose of the presence of the contact hole H is achieved when it is in contact with the first conductivity-type semiconductor layer 131. Thus, it is not necessary for the contact hole H to extend to an external surface of the first conductivity-type semiconductor layer 131.

The second electrode layer 133b formed on the second conductivity-type semiconductor layer 133 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 133, and may be formed by using a process such as sputtering, deposition, or the like. A second electrode pad 133a may be formed on the second electrode layer 133b.

The contact hole H may have a form penetrating the second electrode layer 133b, the second conductivity-type semiconductor layer 133, and the active layer 132 so as to be connected to the first conductivity-type semiconductor layer 131. The contact hole H may be formed through an etching process, e.g., inductively coupled plasma-reactive ion etching (ICP-RIE), or the like.

The insulating layer 150 is formed to cover a side wall of the contact hole H and a surface of the second conductivity-type semiconductor layer 133. In this case, at least a portion of the first conductivity-type semiconductor layer 131 corresponding to the bottom of the contact hole H may be exposed. The insulating layer 150 may be formed by depositing an insulating material such as $SiO_2$, $SiO_xN_y$, or $Si_xN_y$.

The first electrode layer 131a may include a conductive via formed by filling a contact hole H with a conductive material. Subsequently, the substrate 120 is formed on the first electrode layer 131a. In this structure, the substrate 120 may be electrically connected to the first conductivity-type semiconductor layer 131 by the conductive via.

The substrate 120 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like. But example embodiments are not limited thereto.

In order to reduce contact resistance, the amount, a shape, a pitch, a contact area with the first and second conductivity-type semiconductor layers 131 and 133, and the like, of the contact hole H may be appropriately regulated. The contact holes H may be arranged to have various shapes in rows and columns to improve current flow. In this case, the conductive via may be surrounded by the insulating layer 150 so as to be electrically separated from the active layer 132 and the second conductivity-type semiconductor layer 133.

Meanwhile, the wavelength conversion layer 140 may be formed on the first conductivity-type semiconductor layer 131. The wavelength conversion layer 140 may include a light-transmissive resin as a basic material and nanofibers and a wavelength conversion material dispersed in the light-transmissive resin.

FIG. 13 illustrates a different type light emitting device that may be installed in a semiconductor light emitting device package according to example embodiments. In example embodiments, the light emitting device may be understood as a so-called nano-LED chip type light emitting device.

In detail, as illustrated in FIG. 13, the light emitting device includes a plurality of nano-light emitting structures 130n formed on the substrate 120. In this example, it is illustrated that the nano-light emitting structure 130n has a core-shell structure as a rod structure, but example embodiments are not limited thereto and the nano-light emitting structure 120n may have a different structure such as a pyramid structure.

The light emitting device includes a base layer 131' formed on the substrate 120. The base layer 131' is a layer providing a growth surface for the nano-light emitting structure 130n, which may be a first conductivity-type semiconductor layer. A mask layer 151 having an open area for the growth of the nano-light emitting structure 130n (in particular, the core) may be formed on the base layer 131'. The mask layer 151 may be made of a dielectric material such as $SiO_2$ or $SiN_x$.

In the nano-light emitting structure 130n, a first conductivity-type nano-core 131 is formed by selectively growing a first conductivity-type semiconductor by using the mask layer 151 having an open area, and the active layer 132 and the second conductivity-type semiconductor layer 133 are formed as shell layers on a surface of the nano-core 131. Accordingly, the nano-light emitting structure 130n may have a core-shell structure in which the first conductivity-type semiconductor is a nano-core and the active layer 132 and the second conductivity-type semiconductor layer 133 enclosing the nano-core are shell layers.

The light emitting device includes a filler material 137 filling spaces between the nano-light emitting structures 130n. The filler material 137 may structurally stabilize the nano-light emitting structures 130n. The filler material 137 may be made of a transparent material such as $SiO_2$, or the like, but example embodiments are not limited thereto. The ohmic-contact layer 133b may be formed on the nano-light emitting structures 130n and connected to the second conductivity-type semiconductor layer 133. The light emitting device includes the base layer 131' formed of the first conductivity-type semiconductor and first and second electrodes 131a and 133a connected to the base layer 131' and the ohmic-contact layer 133b, respectively.

By forming the nano-light emitting structures 130n such that they have different diameters, components, and doping densities, light beams having two or more different wavelengths may be emitted from the single element. By appropriately adjusting light beams having different wavelengths, white light may be implemented without using phosphors in the single element, and light beams having various desired colors or white light beams having different color temperatures may be implemented by combining a different LED chip to the foregoing element or combining wavelength conversion materials such as phosphors.

In the case of the light emitting device using the nano-light emitting structure 130n, since a light emitting area is increased by utilizing the nano-structure, luminous efficiency can be enhanced, and since a non-polar active layer is obtained, a degradation of efficiency due to polarization can be limited (and/or prevented), improving drop characteristics. In particular, since recombination density of non-radiative recombination is low, a relatively small amount of heat is generated, effectively improving mismatch in coefficients of thermal expansion.

Also, the wavelength conversion layer 140 may be formed on the ohmic-contact layer 133b. In order to limit (and/or prevent) damage to the wavelength conversion layer due to mismatch in coefficients of thermal expansion, the wavelength conversion layer 140 may include a light-transmissive resin as a basic material thereof and nanofibers and a wavelength conversion material dispersed in the light-transmissive resin.

Meanwhile, besides the foregoing light emitting devices, light emitting devices having various other structures may also be employed in a light emitting device package according to example embodiments. For example, a light emitting device in which surface-plasmon polaritons (SPP) are formed in a metal-dielectric boundary to interact with quantum well excitons, thus obtaining significantly improved light extraction efficiency, may also be advantageously used.

Figure 14:
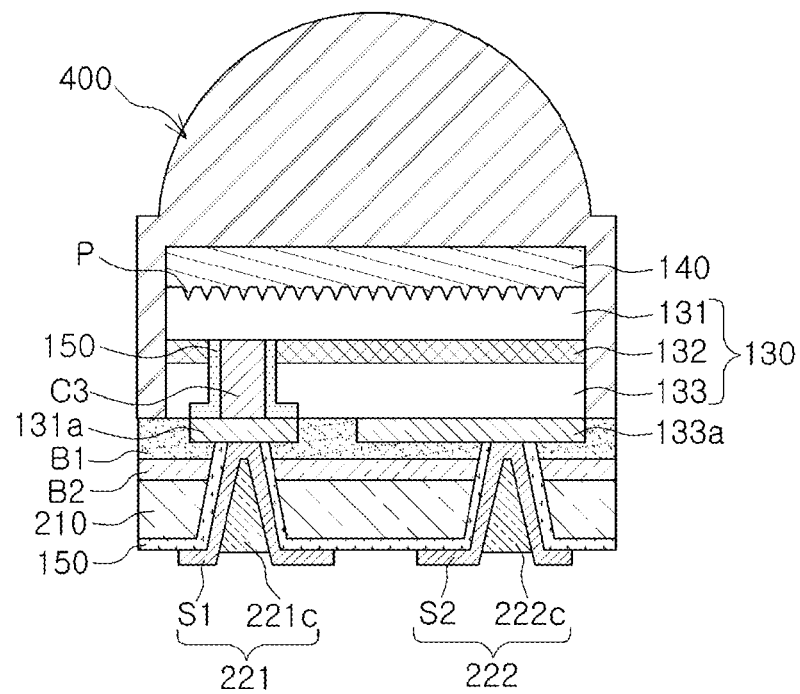
FIG. 14 is a cross-sectional view of a light emitting device and a light emitting device package according to example embodiments.

FIG. 14 is a cross-sectional view of a light emitting device and a light emitting device package according to example embodiments. Example embodiments may be understood as being implemented as a chip scale package (CSP).

In detail, referring to FIG. 14, the light emitting device according to example embodiments includes the light emitting laminate 130 and the wavelength conversion layer 140, and the light emitting device package according to example embodiments includes the package body 210 including the first and second electrode structures 221 and 222, and the light emitting device and a lens 400 disposed on the package body 210.

The light emitting laminate 130 has a lamination structure including the first and second conductivity-type semiconductor layers 131 and 133 and the active layer 132 disposed therebetween. In example embodiments, the first and second conductivity-type semiconductor layers 131 and 133 may be p-type and n-type semiconductor layers, respectively, and may be made of a nitride semiconductor, e.g., $Al_xIn_yGa_{(1-x-y)}N$ ($0 \leq x \leq 1$, $0 \leq y \leq 1$, $0 \leq x+y \leq 1$). However, besides a nitride semiconductor, a GaAs-based semiconductor or GaP-based semiconductor may also be used.

The active layer 132 formed between the first and second conductivity-type semiconductor layers 131 and 133 may emit light having a desired (or alternatively predetermined) level of energy according to electron-hole recombination, and may have a multi-quantum well (MQW) structure in which a quantum well layer and a quantum barrier layer are alternately laminated. In the case of the MQW structure, for example, an InGaN/GaN or AlGaN/GaN structure may be used.

Meanwhile, the first and second conductivity-type semiconductor layers 131 and 133 and the active layer 132 may be formed by using a semiconductor growth process such as metal-organic chemical vapor deposition (MOCVD), molecular beam epitaxy (MBE), hydride vapor phase epitaxy (HVPE), or the like.

The light emitting device illustrated in FIG. 14 is in a state in which a growth substrate was removed, and depressions and protrusions P may be formed on the surface from which the growth substrate was removed. Also, the wavelength conversion layer 140 may be applied to the uneven surface, as a light conversion layer. Here, the wavelength conversion layer 140 may include a light-transmissive resin as a basic material and a wavelength conversion material dispersed therein.

The light emitting device includes the first and second electrodes 131a and 133a connected to the first and second conductivity-type semiconductor layers 131 and 133, respectively. The first electrode 131a may have a conductive via C3 connected to the first conductivity-type semiconductor layer 131 through the second conductivity-type semiconductor layer 133 and the active layer 132. The insulating layer 150 is formed between the active layer 132 and the second conductivity-type semiconductor layer 133 in the conductive via C3 to limit (and/or prevent) a short-circuit occurrence.

A single conductive via C3 is illustrated, but two or more conductive vias C3 may be provided to advantageously distribute current, and may be arranged in various forms.

The package body 210 employed in this example may include a resin as a basic material thereof, and include nanofibers and light-reflective powder particles dispersed in the resin. Here, the package body 210 and the light emitting device may be bonded by bonding layers B1 and B2. The bonding layers B1 and B2 may be made of an electrically insulating material or an electrically conductive material. For example, the electrically insulating material may include an oxide such as $SiO_2$, SiN, or the like, a resin material such as a silicone resin, an epoxy resin, or the like. The electrically conductive material may include silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal alloy thereof. This process may be implemented such that the first and second bonding layers B1 and B2 are applied to respective bonding surfaces of the package body 210 and the package body 210 and the light emitting device and subsequently bonded.

A contact hole is formed from a lower surface of the package body 210 so as to be connected to the first and second electrodes 131a and 133a of the light emitting device as bonded. The insulating layer 150 may be formed on a lateral surface of the contact hole and on a lower surface of the package body. In a case in which the package body 210 is a silicon substrate, the insulating layer 150 may be provided as a silicon oxide film through thermal oxidation. The contact hole is filled with a conductive material to form the first and second electrodes 221 and 222 such that they are connected to the first and second electrodes 131a and 133a. The first and second electrode structures 221 and 222 may include seed layers S1 and S2 and plating charged units 221c and 222c formed through a plating process by using the seed layers S1 and S2.

The chip-scale package (CSP) as described above and as illustrated in FIG. 14, reducing a size of the light emitting device package and simplifying a manufacturing process, is appropriate for mass-production, and since the light emitting device including the wavelength conversion layer according to example embodiments and the optical structure such as the lens can be integrally manufactured, the CSP can be appropriately employed in a light emitting apparatus, or the like.

Meanwhile, in example embodiments, matching of coefficients of thermal expansion as major characteristics of a material constituting the package body and the wavelength conversion layer has been largely described, but the package body and the wavelength conversion layer according to example embodiments can have remarkably improved tensile strength, in comparison to a case in which only a resin is employed as a basic material.

Figure 15:
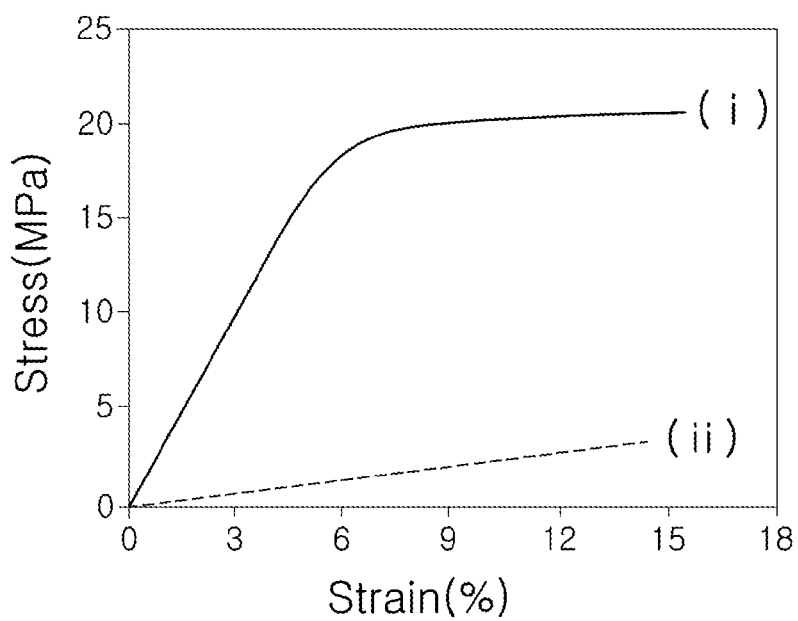
FIG. 15 is a graph showing characteristics of a package body and a wavelength conversion layer according to example embodiments.

FIG. 15 is a graph showing characteristics of a package body and a wavelength conversion layer according to example embodiments. In detail, (i) is a stress-strain curve when nanofibers are contained in the amount of 0.1% to 5% in a resin, and (ii) is a stress-strain curve of a resin not containing nanofibers. For the curves (i) and (ii), an acrylic resin was used.

Referring to FIG. 15, it can be seen that in the case (i) in which nanofibers are dispersed in a resin, stress to be applied to generate the same strain is significantly increased, in comparison to the case (ii) in which only the resin is employed as a basic material.

Namely, in the light emitting device package according to example embodiments, a difference in coefficients of thermal expansion between the light electrode structure, the light emitting device, and the package body is significantly reduced and tensile strength of the package body is increased, and thus, defects due to deformation of the package body due to differences in coefficients of thermal expansion can be effectively improved.

In addition, in the light emitting device according to example embodiments, a difference in coefficients of thermal expansion in the surfaces of contact between the light emitting laminate and the wavelength conversion layer is significantly reduced and tensile strength of the wavelength conversion layer is increased, and thus, a degradation of optical properties due to deformation of the wavelength conversion layer can be improved.

Figure 16:
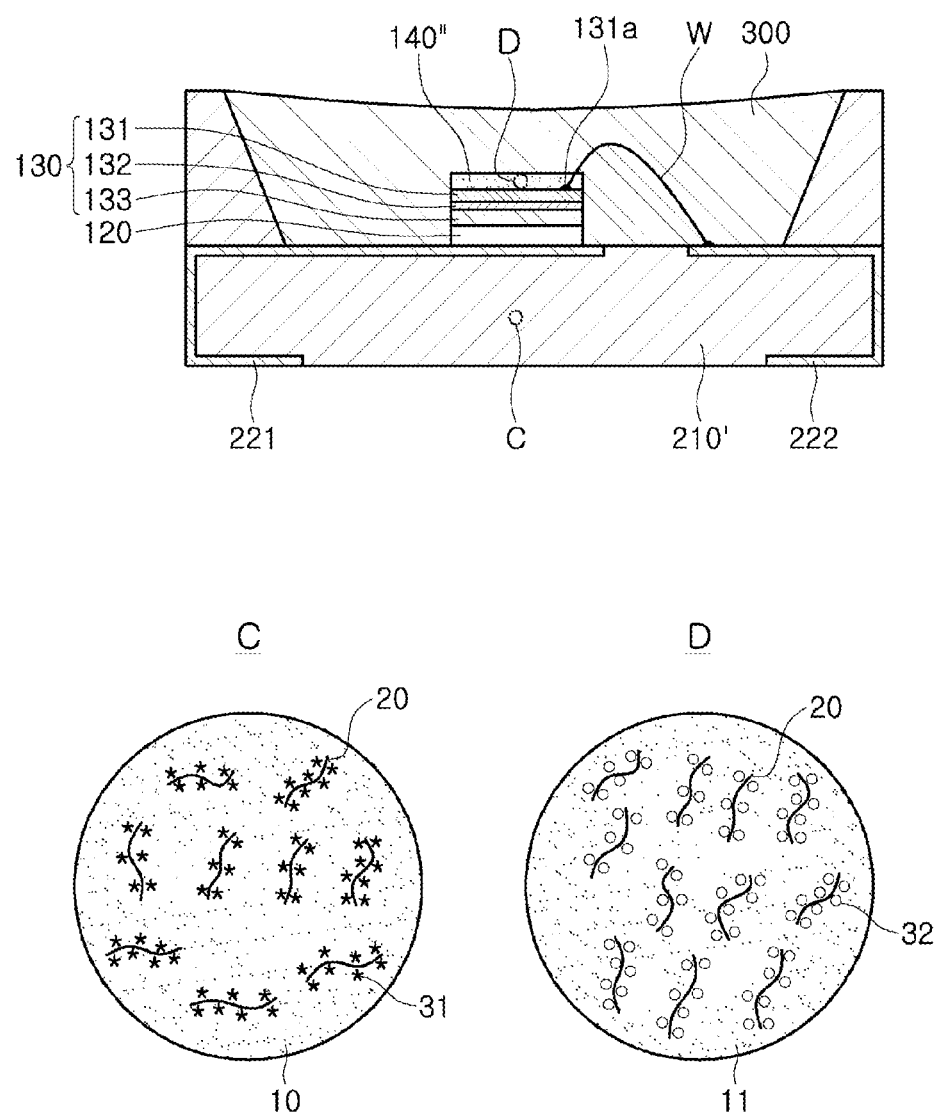
FIG. 16 is a cross-sectional view of a light emitting device and a light emitting device package according to example embodiments.

FIG. 16 is a cross-sectional view of a light emitting device and a light emitting device package according to example embodiments.

Referring to FIG. 16, according to example embodiments, a light emitting device and a light emitting device package may be the same as the light emitting device and light emitting device page described previously in FIG. 1, except for the structure of the package body 210' and the wavelength conversion layer 140" compared to the package body 210 and wavelength conversion layer 140 in FIG. 1. As shown in region C of FIG. 16, the package body 210' may include a resin as a basic material and nanofibers 20 with light-reflective powder particles 31 adhered to the nanofibers 20. As shown in region D of FIG. 16, the wavelength conversion layer 140" may include a light-transmissive resin 11 as a basic material with wavelength conversion material 32 adhered to nanofibers 20 dispersed in the light-transmissive resin 11.

Figure 17:
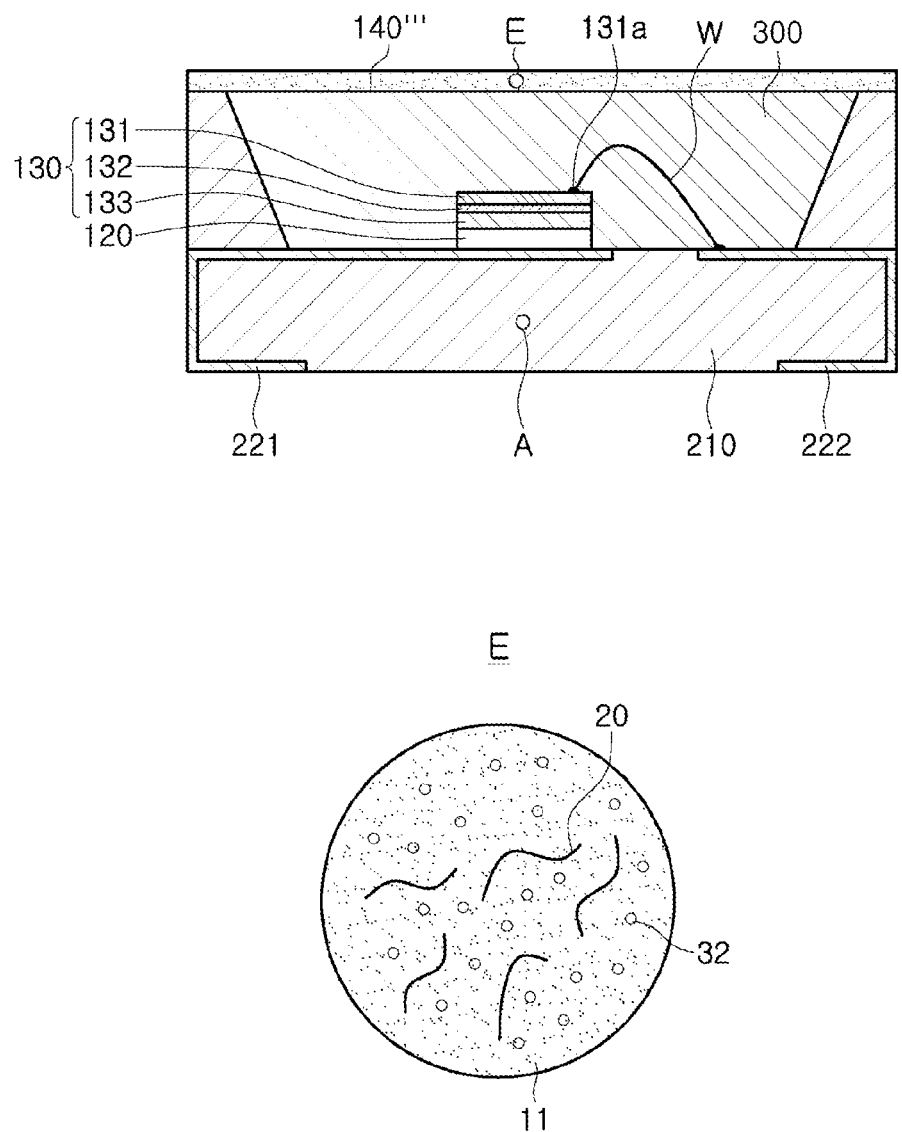
FIG. 17 is a cross-sectional view of a light emitting device and a light emitting device package according to example embodiments.

FIG. 17 is a cross-sectional view of a light emitting device and a light emitting device package according to example embodiments.

Referring to FIG. 17, according to example embodiments, a light emitting device and a light emitting device package may be the same as the light emitting device and light emitting device page described previously in FIG. 1, except for the structure of the wavelength conversion layer 140''' compared to the wavelength conversion layer 140 in FIG. 1. As shown in region E of FIG. 17, the wavelength conversion layer 140' may include a light-transmissive resin 11 as a basic material with wavelength conversion material 32 and nanofibers 20 dispersed in the light-transmissive resin 11. Unlike the wavelength conversion layer 140 in FIG. 1, the wavelength conversion layer 140''' in FIG. 17 may be spaced apart from the light emitting laminate 130. For example, the wavelength conversion layer 140''' in FIG. 17 may be on an upper surface of the encapsulation unit 300.

As set forth above, according to example embodiments, a light emitting device package in which a defect due to a difference between coefficients of thermal expansion is improved can be obtained.

According to example embodiments, a light emitting device having a wavelength conversion unit, in which a degradation of optical quality is improved, can be obtained.

While some example embodiments have been particularly shown and described, it will be understood by one of ordinary skill in the art that variations in form and detail may be made therein without departing from the spirit and scope of the claims.

What is claimed is:

1. A light emitting device package comprising:
    a package body including nanofibers and light-reflective particles dispersed in a resin;
    first and second electrodes in the package body; and
    a light emitting device on the package body,
        the light emitting device being electrically connected to the first and second electrodes.

2. The light emitting device package of claim 1, wherein the resin includes one of epoxy, silicone, modified silicone, a urethane resin, an oxetane resin, acryl, polycarbonate, polyimide, and any combination thereof.

3. The light emitting device package of claim 1, wherein the nanofibers include at least one of chitin and cellulose.

4. The light emitting device package of claim 1, wherein a width of the nanofibers is equal to or less than about 80 nm.

5. The light emitting device package of claim 1, wherein a length of the nanofibers is equal to or greater than about 1 μm.

6. The light emitting device package of claim 1, wherein a weight ratio of the nanofibers to the resin ranges from 1% to about 5%.

7. The light emitting device package of claim 1, wherein a coefficient of thermal expansion of the package body ranges from about 4 ppm/K to 10 ppm/K at a temperature ranging from about 20° C. to about 150° C.

8. The light emitting device package of claim 1, wherein a weight ratio of the light-reflective particles to the resin ranges from about 20% to about 80%.

9. A light emitting device comprising:
    a light emitting laminate including a first conductivity-type semiconductor layer, an active layer, and a second conductivity-type semiconductor layer stacked on each other,
        the active layer between the first and second conductive-type semiconductor layers; and
    a wavelength conversion layer on the light emitting laminate,
        the wavelength conversion layer including nanofibers and a wavelength conversion material dispersed in a light-transmissive resin,
    wherein the nanofibers include at least one of chitin and cellulose.

10. The light emitting device of claim 9, wherein a weight ratio of the nanofibers to the resin ranges from 0.1% to less than 1%.

11. The light emitting device of claim 9, wherein one surface of the wavelength conversion layer contacts the light emitting laminate.

12. The light emitting device of claim 9, wherein the wavelength conversion layer directly contacts a light emitting surface of the light emitting laminate.

13. The light emitting device of claim 9, wherein a thickness of the wavelength conversion layer ranges from about 20 μm to about 200 μm.

14. The light emitting device of claim 9, wherein a weight ratio of the wavelength conversion material to the resin ranges from about 50% to about 300%.

15. A light emitting device comprising:
    a light emitting laminate; and
    a wavelength conversion layer on the light emitting laminate,
        the wavelength conversion layer including nanofibers and a wavelength conversion material dispersed in a light-transmissive resin,
    wherein a width of the nanofibers is less than or equal to 80 nm.

16. The light emitting device of claim 15, wherein at least some of the nanofibers are spaced apart from at least some of the wavelength conversion material.

17. The light emitting device of claim 15, wherein
    the nanofibers include at least one of chitin and cellulose.

18. A light emitting device package comprising:
a package body including fibers and light-reflective particles dispersed in a resin material; and
the light-emitting device of claim 15 on the package body.

19. The light emitting device package of claim 18, wherein the fibers include at least one of chitin and cellulose, and a width of the fibers is less than or equal to 80 nm.

\* \* \* \* \*